(12) United States Patent
Chen et al.

(10) Patent No.: US 9,985,203 B2
(45) Date of Patent: May 29, 2018

(54) RESISTIVE RANDOM ACCESS MEMORY (RRAM) WITH IMPROVED FORMING VOLTAGE CHARACTERISTICS AND METHOD FOR MAKING

(71) Applicant: Taiwan Semiconductor Manufacturing Company, Ltd., Hsin-Chu (TW)

(72) Inventors: Jonathan Tehan Chen, Hsin-Chu (TW); Chung-Cheng Chou, Hsin-Chu (TW); Po-Hao Lee, Hsin-Chu (TW); Kuo-Chi Tu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days. days.

(21) Appl. No.: 14/081,916

(22) Filed: Nov. 15, 2013

(65) Prior Publication Data

US 2015/0137059 A1 May 21, 2015

(51) Int. Cl.
| H01L 47/00 | (2006.01) |
| H01L 45/00 | (2006.01) |
| H01L 27/24 | (2006.01) |

(52) U.S. Cl.
CPC ...... *H01L 45/1253* (2013.01); *H01L 27/2463* (2013.01); *H01L 45/04* (2013.01); *H01L 45/1233* (2013.01); *H01L 45/1273* (2013.01); *H01L 45/146* (2013.01); *H01L 45/16* (2013.01); *H01L 45/1675* (2013.01)

(58) Field of Classification Search
CPC ....... H01L 45/04; H01L 45/06; H01L 45/065; H01L 45/1253; H01L 27/2463; H01L 45/1273; H01L 45/1233
See application file for complete search history.

(56) References Cited

U.S. PATENT DOCUMENTS

| 5,534,711 A | * | 7/1996 | Ovshinsky | G11C 11/56 |
| | | | | 257/2 |
| 6,362,012 B1 | * | 3/2002 | Chi | H01L 23/5223 |
| | | | | 257/275 |

(Continued)

FOREIGN PATENT DOCUMENTS

| CN | 102157688 A | 8/2011 |
| CN | 102217067 A | 10/2011 |

(Continued)

OTHER PUBLICATIONS

Baek et al., International Electron Device Meeting 2004, pp. 587-590. Published by IEEE in 2004.*

(Continued)

*Primary Examiner* — Jesse Y Miyoshi
*Assistant Examiner* — Tuan A Hoang
(74) *Attorney, Agent, or Firm* — Slater Matsil, LLP (57) ABSTRACT

The present disclosure provides resistive random access memory (RRAM) structures and methods of making the same. The RRAM structures include a bottom electrode having protruded step portion that allows formation of a self-aligned conductive path with a top electrode during operation. The protruded step portion may have an inclination angle of about 30 degrees to 150 degrees. Multiple RRAM structures may be formed by etching through a RRAM stack.

21 Claims, 7 Drawing Sheets

(56) References Cited

U.S. PATENT DOCUMENTS

| | | | |
|---|---|---|---|
| 7,615,459 B1* | 11/2009 | Inoue | H01L 45/1226 438/385 |
| 8,389,972 B2* | 3/2013 | Mikawa | H01L 27/101 257/2 |
| 8,513,639 B2 | 8/2013 | Cai et al. | |
| 2006/0006471 A1 | 1/2006 | Rossel et al. | |
| 2010/0207091 A1* | 8/2010 | Sakamoto | H01L 45/04 257/2 |
| 2011/0220863 A1 | 9/2011 | Mikawa et al. | |
| 2012/0164813 A1* | 6/2012 | Rossel et al. | 438/382 |
| 2013/0075683 A1* | 3/2013 | Fowler | H01L 45/00 257/2 |
| 2013/0313507 A1* | 11/2013 | Song | H01L 45/04 257/4 |
| 2014/0061573 A1* | 3/2014 | Mikawa | H01L 45/08 257/4 |
| 2015/0103583 A1* | 4/2015 | Tada | G11C 13/0002 365/148 |

FOREIGN PATENT DOCUMENTS

| | | | |
|---|---|---|---|
| JP | 2009146943 A | | 2/2009 |
| JP | 2010062265 A | * | 3/2010 |
| JP | 2013168454 | | 8/2013 |

OTHER PUBLICATIONS

Chen et al., Thin Solid Films 353, 264-273. Published by Elsevier in 1999.*

Chen et al. "Phase formation behavior and diffusion barrier property of reactively sputtered tantalum-based thin films used in semiconductor metallization" in Thin Solid fFilms vol. 353, pp. 264. Published by Elsevier in 1999.*

Baek et al. "Highly scalable non-volatile resistive memory using simple binary oxide driven by asymmetric unipolar voltage pulses" in IEDM 2004. Published by IEEE in 2004.*

Serda and Quirk "Semiconductor Manufacturing Technology" p. 438. Published by Prentice Hall in 2001.*

Baek et al. International Electron Device Meeting 2004, pp. 587-590. Published by IEEE in 2004.*

Chen et al. Thin Solid Films 353, pp. 264-273. Published by Elsevier in 1999.*

Chen et al. "Phase formation behavior and diffusion barrier property of reactively sputtered tantalum-based thin films used in semiconductor metallization" in Thin Solid Films 353, pp. 264-273. Published by Elsevier in 1999.*

Baek et al. "Highly scalable non-volatile resistive memory using simple binary oxide driven by asymmetric unipolar voltage pulses" in IEEE International Electron Devices Meeting 2004, pp. 587-590. Published by IEEE in 2004.*

* cited by examiner

RESISTIVE RANDOM ACCESS MEMORY (RRAM) WITH IMPROVED FORMING VOLTAGE CHARACTERISTICS AND METHOD FOR MAKING

FIELD

The disclosure relates to semiconductor devices and, more particularly, to resistive random-access memory (RRAM) device structures and layouts and methods for making the RRAM devices.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1." RRAM devices operate under the principle that a dielectric, which is normally insulating, can be made to conduct through a filament or conduction path formed after the application of a sufficiently high voltage in a "soft breakdown" of the dielectric. The forming of a filament or conduction path is the forming operation or forming process of the RRAM. The sufficiently high voltage is the 'forming' voltage. The conduction path formation can arise from different mechanisms, including defect, metal migration, and other mechanism. Once the filament or conduction path is formed, it may be "reset", i.e. broken, resulting in high resistance or "set", i.e. re-formed, resulting in lower resistance, by an appropriately applied voltage. However, improvements in RRAM design and method of manufacturing continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

As discussed, the form voltage is higher than that of the read, reset and the set voltage. A conventional form voltage may be about 3.0 to about 3.5 volts or about 3.5 volts or higher. When a RRAM is paired with a transistor in a 1T1R configuration, a drain side of the selector transistor may be damaged during the formation process because the form voltage may be larger than operating voltage of the transistor. A reduction of the form voltage reduces the likelihood of transistor damage. Further, during the forming process, filaments are formed in random locations due to a uniform electric field, resulting in a large distribution of low resistance values which may be harder to reset. The process for making a RRAM may involve using two or more photomasks, the cost of which is a significant portion of the manufacturing cost. Thus, a method for making a RRAM that involves fewer photomasks increases the viability and likelihood of wide adaptation for the technology.

Figure 1:
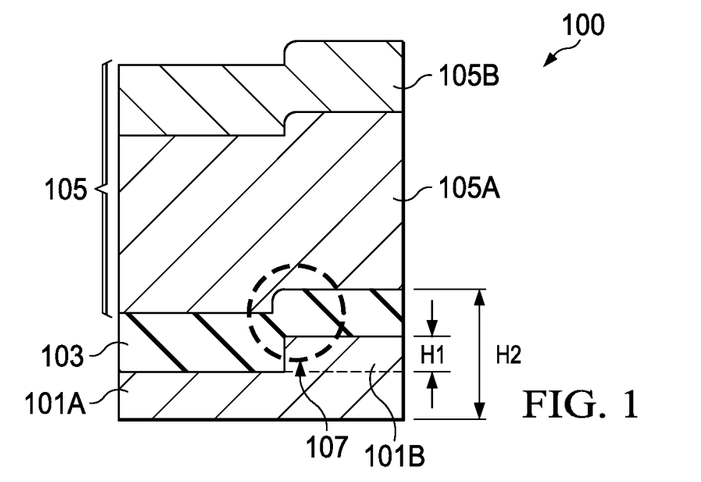
FIG. 1 is a cross sectional view of a resistive random access memory (RRAM) structure in accordance with various embodiments of the present disclosure.

FIG. 1 is a cross sectional view of a resistive random access memory (RRAM) structure 100. The RRAM structure 100 includes a bottom electrode 101A/B, a resistive material 103, and a top electrode 105. The bottom electrode is composed of two portions, a planar portion 101A and a protruded step portion 101B. The resistive material 103 is disposed over the bottom electrode 101A/B. The top electrode 105 is disposed over the resistive material 103. The top electrode 105 may include more than one layer, for example, top electrode layers 105A and 105B.

The structure of the bottom electrode 101A/B allows formation of a self-aligned conductive path with a top electrode during the forming operation. The electric field induced during the forming operation localizes the soft breakdown of the resistive material 103 in a region 107 so that the filaments are more likely to be formed in that region 107. The filament localization results in localized low resistance values.

The protruded step portion may have an inclination angle of about 30 degrees to 150 degrees. The protruded step portion has a step height H1. A total height of the bottom electrode 101A/B including H1 is H2. According to various embodiments, H1 is 30% or less of H2, but no less than about 3%. H1 is at least 5 angstroms or at least 10 angstroms in order to affect the electric field. In some embodiments, H1 may be about 50 angstroms.

The RRAM structure 100 has two or more states with different electric resistance values that correspond to a different digital value. For example, the RRAM structure 100 has a state of relatively high resistance, referred to as "a high resistance state", and a state of relatively low resistance, referred to as "a low resistance state". The RRAM structure 100 may be switched from the high resistance state to the low resistance state, or from the low resistance state to high resistance state by applying a predetermined voltage or current to the electrodes.

In a memory bit cell having one transistor and one RRAM (1T1R) the bottom electrode 101A/B is electrically connected to a drain electrode of a transistor through the multi-level interconnect (MLI). In some embodiments, the RRAM structure is placed between the fourth metal layer (M4) and the fifth metal layer (M5). In other embodiments, the RRAM structure is placed between other metal layers. In still other embodiments, the RRAM structure is placed more than once between more than two metal layers. The RRAM structure may be placed more than once when the footprint of the RRAM is larger than that of the corresponding transistor so that a one transistor one RRAM match cannot be made in one layer of RRAM.

The bottom electrode 101A/B may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, AlCu, WN or combinations thereof. The height H2 of the bottom electrode may be between a range about 30-3000 angstroms, or between about 100-1000 angstroms. The planar portion 101A may include one or more layers, which may include a conductive barrier material to a metal feature below. In one embodiment, the planar portion 101A of the bottom electrode includes a tantalum nitride layer and a titanium nitride layer. In other embodiments, a tantalum nitride layer or a titanium nitride layer or both may be used.

A resistive material layer 103 is formed on the bottom electrode 101A/B and directly contacts to the bottom electrode 101A/B. The thickness of the resistive material layer 103 may be between about 10-500 angstroms. The resistive material layer may include one or more oxide of W, Ta, Ti, Ni, Co, Hf, Ru, Zr, Zn, Fe, Sn, Al, Cu, Ag, Mo, Cr. In some cases, silicon may be included to form a composite material. In some embodiments, hafnium oxide and/or zirconium oxide is used.

A capping layer (not shown) may be formed over the resistive material layer 103. In various embodiments, the capping layer is a metal, for example, titanium, hafnium, platinum, or tantalum. The capping layer may have a thickness ranging between about 20 angstroms and about 150 angstroms, or between about 40 angstroms and about 80 angstroms.

A top electrode 105 is formed over the resistive material layer 103 or the optional capping layer. The top electrode 105 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, AlCu, WN or combinations thereof. The height of the top electrode may be between a range about 30-3000 angstroms, or between about 100-1000 angstroms. The top electrode may be formed of more than one layer, for example, two layers as shown in FIG. 1. In FIG. 1, the top electrode includes a first layer 105A and a second layer 105B. In some embodiments, the first layer 105A is Ti. In some embodiments, the second layer 105B is TaN. The first layer 105A may also be referred to as a capping layer.

During a forming operation, a specified voltage is conducted across the RRAM structure between the bottom electrode 101A/B and the top electrode 105. The forming voltage is usually a different voltage from the voltage used to read and write the RRAM and is usually at a higher absolute value or has a different polarity. In one example, the forming voltage may be between about 3 volts and 3.5 volts, or greater. According to various embodiments, a protruded step portion of the bottom electrode increases the electric field at the top corner of the protruded step portion. This is believed to reduce the form voltage by at least 10%, or between about 15% and about 20%, as compared to a similarly sized RRAM having only a planar portion. In other words, a forming voltage of a RRAM cell in accordance with various embodiments of the present disclosure may be about 3 volts or less, and may be about 2.8 volts or about 2.9 volts or less.

After the forming operation, one or more filament conductors are disposed across the resistive material layer 103, around region 107. The resistance across the resistive material layer 103 is at a low value and a high current may be passed when the transistor is selected. During a write operation, the one or more filament conductors may be broken by passing a voltage different from the forming voltage. In some embodiments, the 'write' voltage may have a different polarity than the forming voltage. In one example, the voltage difference is about 1 volt in an opposite polarity. After the one or more filament conductors are broken, the resistance across the resistive material layer 103 is at a high value and a low current or no current may be passed. Subsequent write operations apply yet a different voltage that is less than the forming voltage to reconnect the broken filament conductors. By changing the filament conductors, a high or low resistance is stored in the memory cell that does not change when the power is removed. Either the high resistance or the low resistance may be read as a "0" or "1", respectively. During a read operation, a 'read' voltage is applied across the RRAM structure. In some examples, the 'read' voltage is between about 0.3 volts to about 0.5 volts. The 'read' voltage is much smaller than the 'write' voltage to avoid inadvertent writing of the memory cell to a different value.

A RRAM is usually connected to an array of RRAMs either embedded in a logic device or as a stand-alone memory device. Memory cell arrays are organized into bit lines and word lines. The bit line contact is connected to the bit line of the memory cell array and the gate contact is connected to the word line of the memory cell array.

Figure 2:
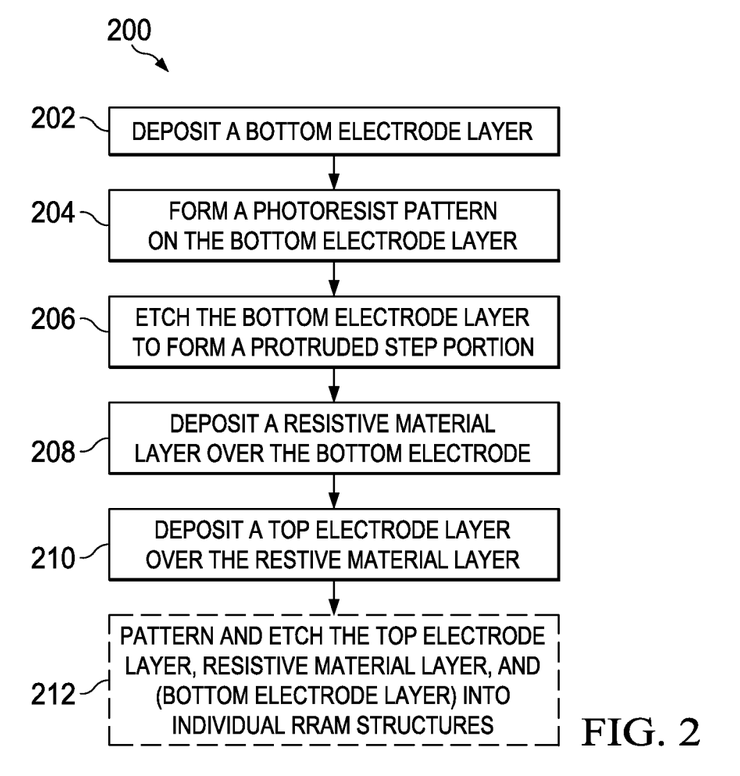
FIG. 2 is a flowchart of a method for making a RRAM array according to aspects of the present disclosure in various embodiments.

FIG. 2 is a flowchart of a method 200 for making a RRAM array according to aspects of the present disclosure in various embodiments. Various operations of the method 200 are discussed in association with cross-section diagrams 3-7B. In operation 202 of method 200, a bottom electrode layer is deposited on a semiconductor substrate. The semiconductor substrate may have transistors and one or more metal/dielectric layers over the transistors thereon. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The wafer may be in various stages of fabrication and is processed using the CMOS process. The transistors are formed by known transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, four metal/dielectric layers are formed over the transistors including a contact to the bottom electrode for each RRAM structure.

The bottom electrode layer is deposited over the contacts embedded in a dielectric layer. The bottom electrode layer may be tantalum nitride, titanium nitride, tungsten, or copper deposited using a physical vapor deposition (PVD) process or a plating process. In some cases, a liner or a barrier layer may be deposited first, followed by a deposition of the bulk material using one of the known deposition methods.

Figure 3:
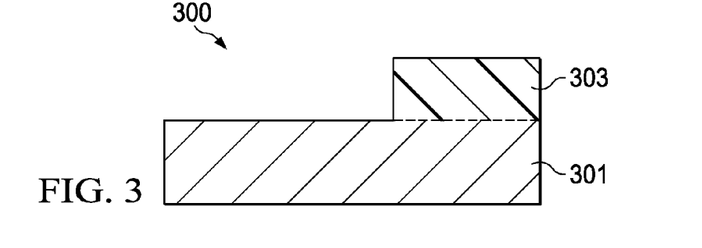
FIG. 3 is a cross section diagram of portions of a wafer in an intermediate stage of manufacture according to an exemplary embodiment.

In operation 204, a photoresist pattern is formed on the bottom electrode layer. The photoresist pattern will be used to form the protruded step portion of the bottom electrode. A photolithographic process to form the photoresist pattern involves depositing the photoresist, soft baking, exposing a portion of the photoresist to a light, and developing the photoresist to remove a portion of the photoresist. In some embodiments, a hardmask layer is used between the bottom electrode layer and the photoresist as an etch mask. The hardmask layer may be a silicon-based spin-on material or a silicon-based material deposited using CVD, such as silicon nitride, certain types of silicon oxide, and versions of these with doping of carbon, oxygen, and other materials can be used. The layers can also include an antireflective coating to reduce the amount of reflection from the bottom electrode layer during patterning. FIG. 3 is a cross section diagram of portions of a wafer after operation 202 and 204. The structure 300 including a bottom electrode layer 301 and a photoresist pattern 303 over a portion of the bottom electrode layer 301.

Referring back to FIG. 2, in operation 206 the bottom electrode layer is etched to form a protruded step portion. Using the photoresist pattern or a hardmask as an etch mask, a portion of the bottom electrode layer is removed and a protruded step portion is formed under the etch mask. The etch process may involve one or more steps depending on desired shape of the protruded step portion. In some embodiments, the etch involves an anisotropic process including physical bombardment of inert and reactive ions. The etch may also involve isotropic process including dry or wet chemical etch.

Figure 4A:
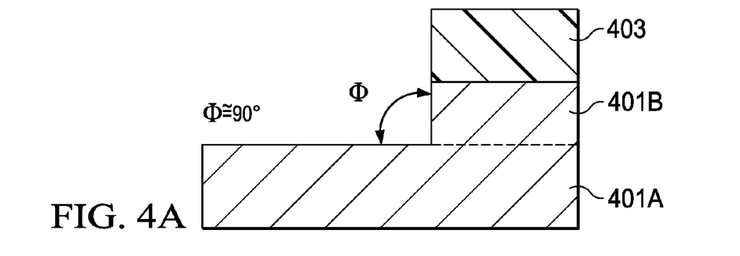
FIGS. 4A-4C are cross sectional diagrams of a wafer in an intermediate stage of manufacture wherein a protruded step is formed according exemplary embodiments.

In some embodiments, the etch forms a protruded step having an inclination angle of about 90 degrees, as shown in FIG. 4A. The etch process removes a portion of the bottom electrode layer 301 from FIG. 3 that is not protected by the photoresist 403. The remaining bottom electrode layer becomes bottom electrode portions 401A and 401B. The bottom electrode portion 401A is planar. The protruded step portion 401B protrudes from the bottom electrode portion 401A. In certain embodiments, a dry etch process using fluorine-containing gas and/or chlorine-containing gas with moderate to high plasma power is used. In one example, the plasma power may be between about 500 to 800 watts. A bias may be applied toward the substrate to direct the etchant.

Figure 4B:
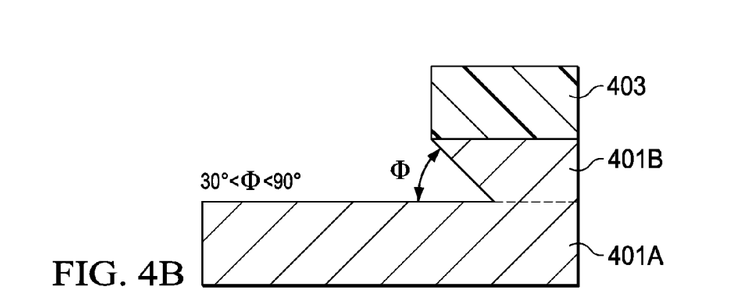

In some embodiments, the etch forms a protruded step having an inclination angle between about 30 degrees and 90 degrees, as shown in FIG. 4B. The etch process removes a portion of the bottom electrode layer 301 from FIG. 3 that is not protected by the photoresist 403. The remaining bottom electrode layer becomes bottom electrode portions 401A and 401B. The protruded step portion 401B protrudes from the bottom electrode portion 401A. In certain embodiments, a dry etch process using fluorine-containing gas and/or chlorine-containing gas with high plasma power is used. The high power plasma along with substrate bias undercuts the protrude step portion. In one example, the plasma power may be between about 600 to 1000 watts. While FIG. 4B shows the undercut with an angle that comes to a point, depending on the etch process the vertex of the inclination may be somewhat rounded.

Figure 4C:
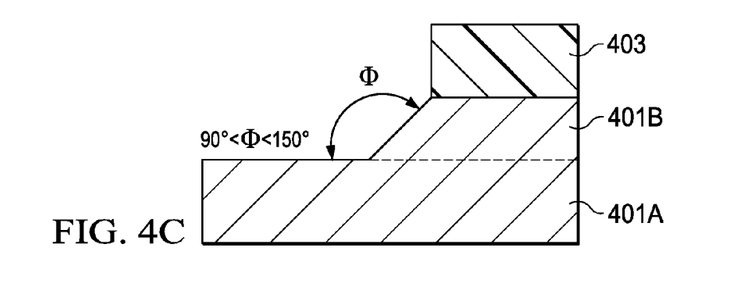

In some embodiments, the etch forms a protruded step having an inclination angle between about 90 degrees and 130 degrees, as shown in FIG. 4C. The etch process removes a portion of the bottom electrode layer 301 from FIG. 3 that is not protected by the photoresist 403. The remaining bottom electrode layer becomes bottom electrode portions 401A and 401B. The bottom electrode portion 401A is planar. The protruded step portion 401B protrudes from the bottom electrode portion 401A. In certain embodiments, a dry etch process using fluorine-containing gas and/or chlorine-containing gas with low plasma power is used. The low power plasma removes less bottom electrode layer material around the photoresist 403. In one example, the plasma power may be between about 200 to 600 watts.

Referring back to FIG. 2, in operation 208, a resistive material layer is deposited over the bottom electrode. The resistive material layer of the RRAM is a metal oxide, which may be hafnium oxide, zirconium oxide, aluminum oxide, nickel oxide, tantalum oxide, titanium oxide, zinc oxide, tungsten oxide, molybdenum oxide, copper oxide, and other known oxides used as a resistive material layer. The metal oxide may have a non-stoichiometric oxygen to metal ratio. Depending on the method of deposition, the oxygen to metal ratio and other process conditions may be tuned to achieve specific resistive material layer properties. In some embodiments, the metal oxide is a transition metal oxide. In other embodiments, the resistive material layer is a metal oxynitride.

The resistive material layer may be formed by a suitable technique, such as atomic layer deposition (ALD) with a precursor containing a metal and oxygen. Other chemical vapor deposition (CVD) techniques may be used. In another example, the resistive material layer may be formed by a physical vapor deposition (PVD), such as a sputtering process with a metallic target and with a gas supply of oxygen and optionally nitrogen to the PVD chamber. In yet another example, the resistive material layer may be formed in an electron-beam deposition process. The resistive material layer may have a thickness ranging between about 10 angstroms and about 500 angstroms, or between about 40 angstroms and about 100 angstroms. Thicker resistive material layers result in higher form voltage. However, a thin resistive material layer may be susceptible to current leakage if over etched and is more sensitive to surface and thickness non-uniformity.

Figure 5A:
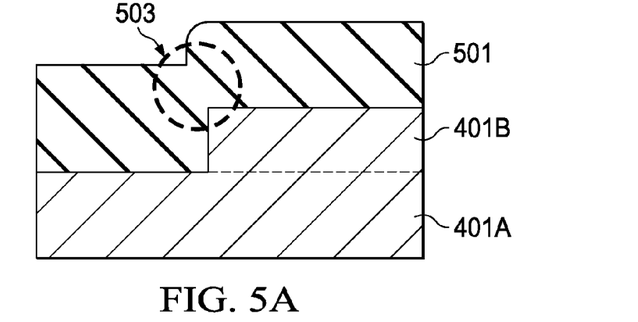
FIGS. 5A-5C are cross sectional diagrams of the protruded step portions of FIGS. 4A, 4B, and 4C with a resistive material layer.
Figure 5B:
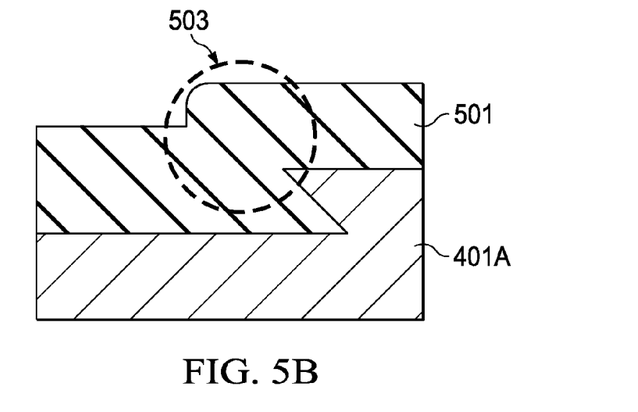
Figure 5C:
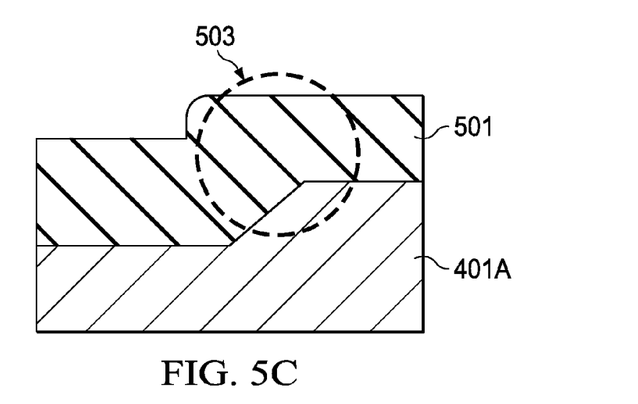

FIGS. 5A, 5B, and 5C are cross sectional diagrams of the protruded step portions of FIGS. 4A, 4B, and 4C with a resistive material layer 501. In FIGS. 5A-5C, the resistive material layer 501 conformally covers the protruded step portion 401B. The shape of the protrusion is not totally translated to the resistive material layer 501. However, there is a height difference between the top surface of the resistive material layer 501 over the protruded step portion 401B and the top surface over the bottom electrode portion 401A not overlapping the protruded step portion 401A. The thickness of the resistive material layer 501 varies slightly. A portion 503 of the resistive material layer 501 may be thinner. The portion 503 is the likely site of filament formation during a forming operation due to the thinner resistive material layer 501 or due to a difference in the electric field in the portion 503.

Referring to FIG. 2, in operation 210, a top electrode layer is deposited over the resistive material layer. The top electrode layer may include one or more layers. A first layer of the top electrode layer may also be referred to as a capping layer. A first layer of the top electrode layer may be a metal layer, for example, titanium, hafnium, platinum, and tantalum. The capping layer may be deposited using a PVD process, a CVD, for example, an ALD process. A second layer of the top electrode layer may be metal, metal-nitride, doped polysilicon or other suitable conductive material. For example, the second layer of the top electrode layer may be tantalum nitride, titanium nitride, or platinum. The second layer of the top electrode layer may be formed by PVD, CVD including ALD, or other suitable technique.

A total thickness of the top electrode layer may range between about 30 angstrom and about 3000 angstroms, or about 100 to about 200 angstroms. The top electrode layer may further include other suitable conductive material to electrically connect the device to other portions of an interconnect structure for electrical routing.

Figure 6A:
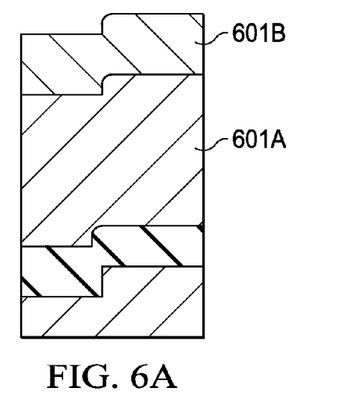
FIGS. 6A-6C are cross-sectional diagram of a top electrode layer over a resistive material layer for different inclination angles of the protrude portion illustrated in FIGS. 4A-4C.
Figure 6B:
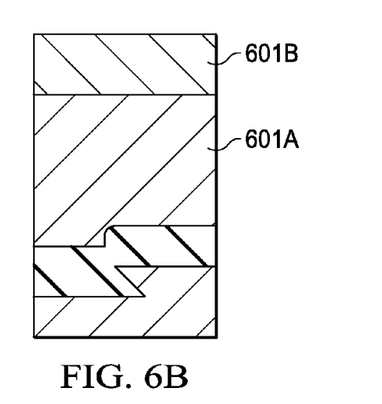
Figure 6C:
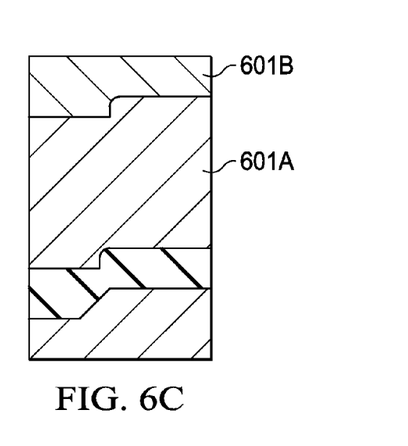

FIGS. 6A, 6B, and 6C are cross-sectional diagram of a top electrode layer over a resistive material layer for different inclination angles of the protrude portion. As shown, the top electrode layer includes two layers 601A and 601B. In some embodiments, the first layer 601A of the top electrode layer may be planarized before depositing the second layer 601B of the top electrode layer, as shown in FIG. 6B. In other embodiments, the second layer 601B of the top electrode layer is planarized, as shown in FIG. 6C. In still other embodiments, the top electrode layer is not planarized, as shown in FIG. 6A.

In some embodiments, the layers are deposited in one system without breaking vacuum. Specifically, one or more of the layers may be deposited in the same chamber or each one in a different chamber on the same vacuum system. In other embodiments, more than one semiconductor processing system is used.

Referring back to FIG. 2, the top electrode layer, resistive material layer, and optionally the bottom electrode layer is patterned and etched into individual RRAM structures in operation 212. A photoresist layer is deposited and patterned over the top electrode layer as an etch mask. The etch process cuts the RRAM stack into individual RRAM structures each having a top electrode, a resistive material layer, and a bottom electrode with a protruded step portion. The etch process may be a biased plasma etch process using chlorine-containing and/or fluorine-containing etchant gas. The photoresist pattern is then removed.

Figure 7A:
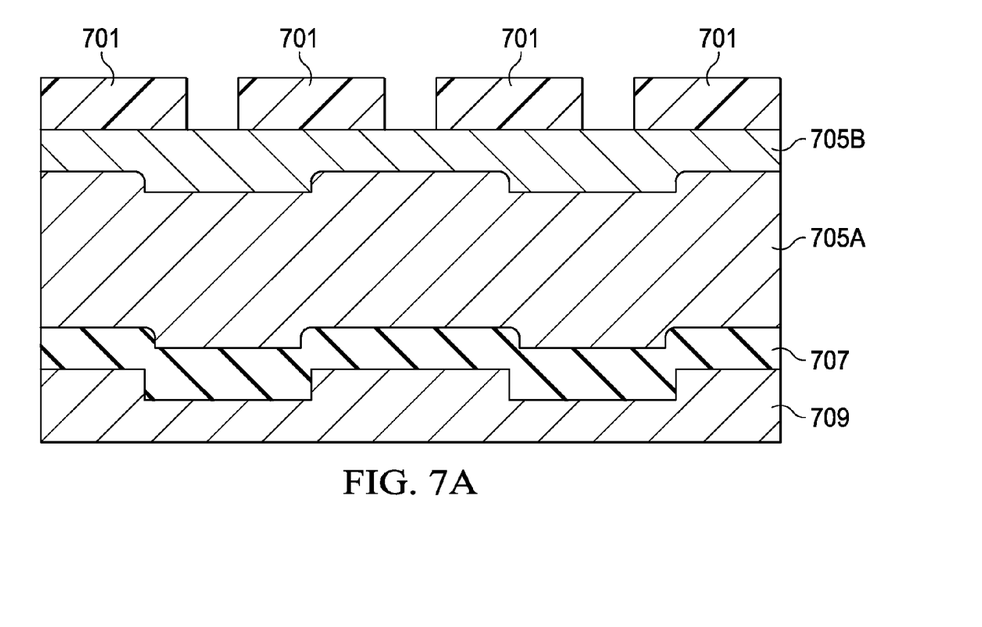
FIGS. 7A and 7B are cross-sectional diagrams of an exemplary RRAM stack in an intermediate stage of fabrication according to the method illustrated in FIG. 2.
Figure 7B:
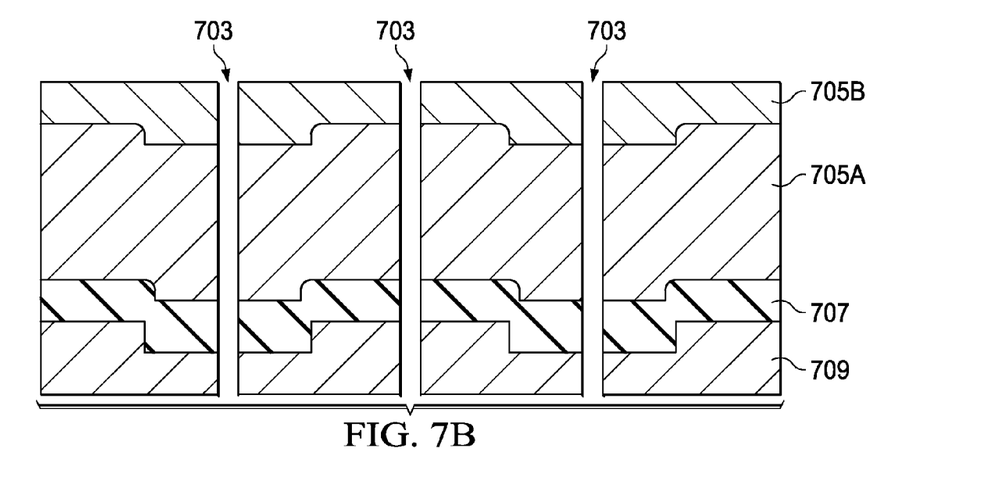

FIGS. 7A and 7B are cross-sectional diagram of a RRAM stack and a number of RRAM structures before and after the etch process of operation 212. FIG. 7A is a cross section of the RRAM stack with a patterned photoresist 701 over the top electrode layer. FIG. 7B is a cross-sectional diagram of a number of RRAM structures having etched trenches 703 between the RRAM structures. Each RRAM structure includes a top electrode 705, a resistive material layer 707, and a bottom electrode 709. As shown in FIG. 7B, the top electrode 705 includes two layers 705A and 705B that has different material.

Figure 8:
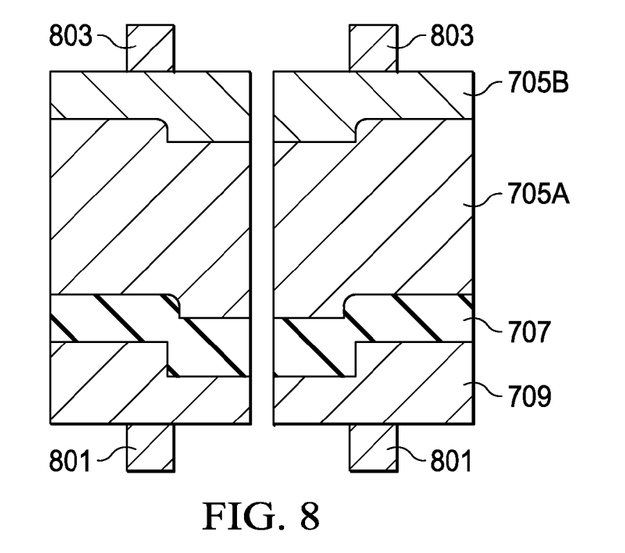
FIG. 8 is a cross-sectional diagram of two RRAM structures each having a bottom electrode contact and a top electrode contact.

FIG. 8 is a cross-sectional diagram of two RRAM structures each having a bottom electrode contact 801 and a top electrode contact 803. The bottom electrode contact 801 may be connected to a transistor which controls the operation of the RRAM structure in a memory cell. In some embodiments, the etch process does not separate the bottom electrodes. Depending on a memory cell configuration, two or more RRAM structures may share a bottom electrode contact while each RRAM structure having its own top contact.

Figure 9:
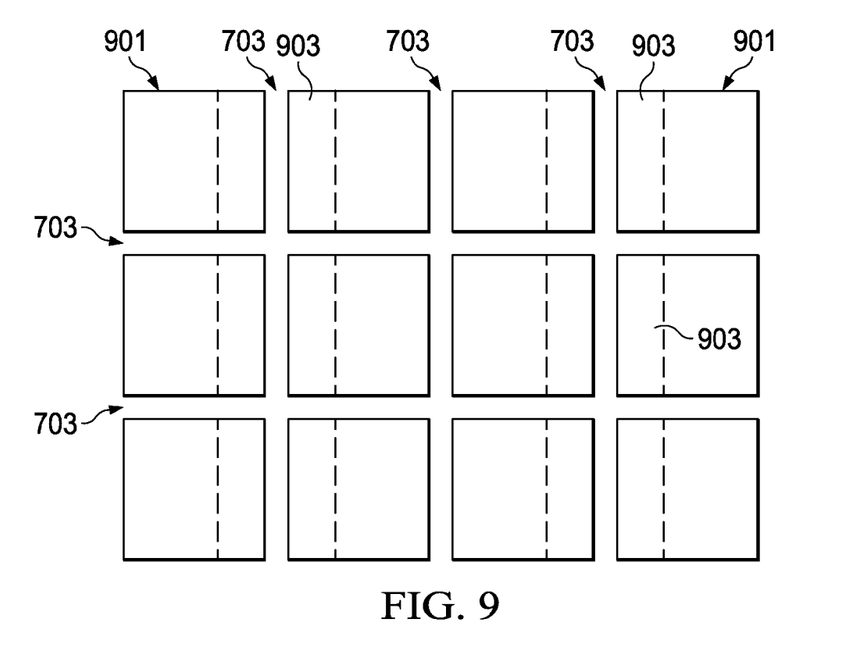
FIG. 9 illustrates in plan view a number of RRAM structures organized in columns and rows, separated by the trenches formed in accordance with the method illustrated in FIG. 2.
Figure 10:
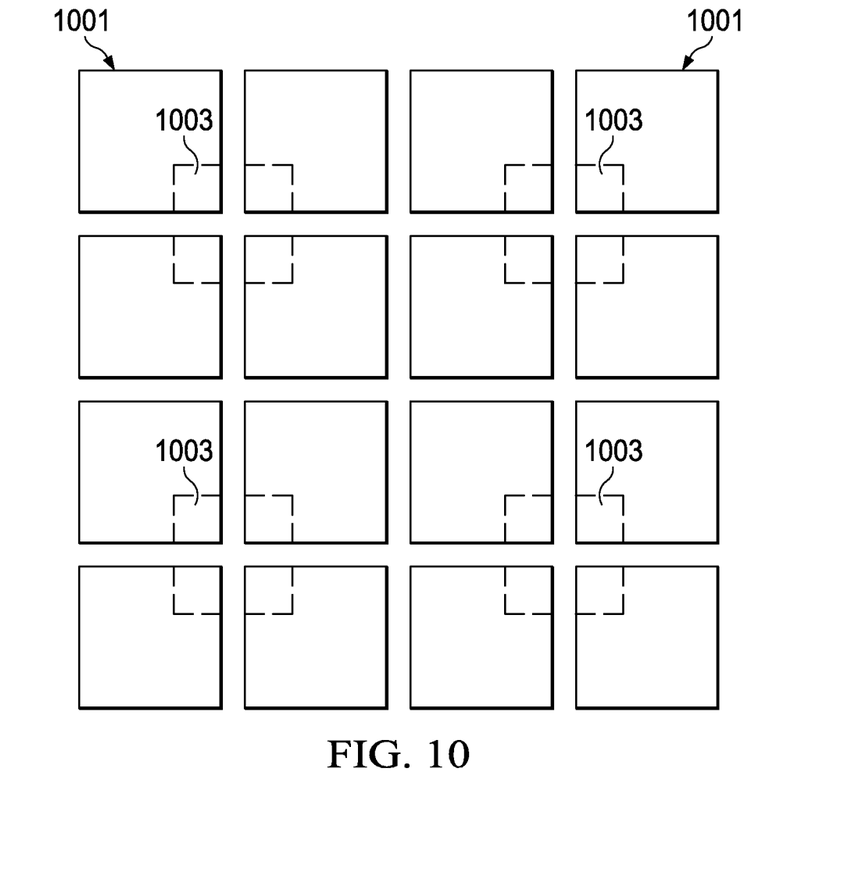
FIG. 10 is a plan view of a number of RRAM structures having protruded step portions.

FIGS. 9 and 10 are top layout views of different configurations of the RRAM structure and the bottom electrode. In FIG. 9, a number of RRAM structures 901 are organized in columns and rows. Each RRAM structure 901 is separated by the trenches 703 formed in operation 212 of FIG. 2 discussed in association with FIGS. 7A and 7B. A dotted line in the layout view shows an edge of the protrude step portion 903. Thus, each adjacent RRAM structure is a mirror image of its nearest neighbor RRAM structure. One RRAM stack may be used to make many RRAM structures in an array.

FIG. 10 is another top layout embodiment of RRAM structures 1001 having protruded step portions 1003. The RRAM structures 1001 are organized in columns and rows. The pattern repeats in a four-RRAM structure array where the protruded portion is formed in a rectangular shape in a RRAM stack that is subsequently separated into four RRAM structures for each protruded portion bottom electrode layer. Each adjacent RRAM structure is a mirror image of its nearest neighbor RRAM structure. One RRAM stack may be used to make many RRAM structures in an array.

In one aspect, the present disclosure pertains to an RRAM. The RRAM includes a bottom electrode having a protruded step portion, a resistive material layer conformally covering the protruded step portion of the bottom electrode, and a top electrode over the resistive material layer. The protruded portion may have an inclination angle less than 90 degrees, about 90 degrees, or up to about 150 degrees. A height of the protruded step portion may be less than about 50 angstroms. A ratio of the protruded step portion to the total height of the bottom electrode may be less than 30%. The top electrode may include a tantalum nitride layer over a titanium layer and/or has a thickness less than about 3000 angstroms.

In another aspect, the present disclosure pertains to an RRAM array having a plurality of RRAM pairs organized in columns and rows, each RRAM pair having two RRAM structures. Each RRAM structure includes a bottom electrode having a protruded step portion a resistive material layer conformally covering the protruded step portion of the bottom electrode, and a top electrode over the resistive material layer. The protruded step portions in each RRAM pair are mirror images.

In yet another aspect, the present disclosure pertains to a method for making RRAM structures. The method includes depositing a bottom electrode layer, forming a photoresist pattern on the bottom electrode layer, etching the bottom electrode layer to form a protruded step portion, depositing a resistive material layer over the bottom electrode, and depositing a top electrode layer over the bottom electrode. In some embodiments, the method also includes patterning and etching the top electrode layer, resistive material layer, and bottom electrode layer into individual RRAM structures. In certain embodiments, the method also includes patterning and etching the top electrode layer and resistive material layer to form individual RRAM structures.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A resistive random access memory (RRAM), comprising:
    a bottom electrode over a substrate, the bottom electrode having a first upper surface and a second uppermost surface with one step transitioning from the first upper surface to the second uppermost surface, the one step being a first step, the first upper surface lower than the second uppermost surface, a resistance of the bottom electrode being independent of a voltage applied to the RRAM that is within an operational voltage range of the RRAM, the first upper surface being a planar surface that extends from an exterior sidewall of the bottom electrode to the first step, the bottom electrode having a sidewall connecting the first upper surface and the second uppermost surface, the sidewall forming an acute angle with the first upper surface;
    a resistive material layer over and on the first step transitioning from the first upper surface to the second uppermost surface of the bottom electrode, the resistive material layer having a second step corresponding to the first step; and
    a top electrode contacting the resistive material layer and covering the second step, the bottom electrode being between the top electrode and the substrate, the top electrode having a third step corresponding to the second step, a resistance of the top electrode being independent of the voltage applied to the RRAM that is within the operational voltage range of the RRAM, the resistive material layer having a same material composition extending from the bottom electrode to the top electrode, the bottom electrode, the resistive material layer, and top electrode having coterminous sidewalls.

2. The RRAM of claim 1, wherein a height of the first step transitioning from the first upper surface to the second uppermost surface is less than 50 angstroms.

3. The RRAM of claim 1, wherein a ratio of a height of the first step transitioning from the first upper surface to the second uppermost surface to a height of the first upper surface of the bottom electrode is less than 30%.

4. The RRAM of claim 1, wherein the top electrode comprises a tantalum nitride layer over a titanium layer.

5. The RRAM of claim 1, wherein the top electrode has a thickness less than 3000 angstroms.

6. The RRAM of claim 1, further comprising a bottom electrode contact overlapping a face of the first step transitioning from the first upper surface to the second uppermost surface in a top view.

7. The RRAM of claim 4, further comprising a capping layer interposed between the top electrode and the resistive material layer, the capping layer comprising hafnium, platinum, or tantalum.

8. The RRAM of claim 1, wherein the top electrode comprises:
    a first conductive layer contacting the resistive material layer; and
    a second conductive layer over the first conductive layer, wherein the second conductive layer is formed of a different material than the first conductive layer, wherein an upper surface of the second conductive layer distal the first conductive layer is planar.

9. The RRAM of claim 8, wherein a lower surface of the second conductive layer facing the first conductive layer is planar and is parallel to the upper surface of the second conductive layer.

10. A resistive random access memory (RRAM) array, comprising:
    a plurality of RRAM pairs over a substrate and organized in columns and rows, each RRAM pair having:
        two RRAM structures, each having:
            a bottom electrode having a first edge with a first upper surface, a second edge with a second upper surface, a sidewall between the first edge and the second edge and between the first upper surface and the second upper surface, and a single protruded step portion transitioning from the first upper surface to the second upper surface, the second upper surface being at a higher level than the first upper surface, the first upper surface being planar and extending from an outermost sidewall of the bottom electrode to the single protruded step portion, the sidewall intersecting the first upper surface at an angle smaller than 90 degrees, a resistance of the bottom electrode being independent of a voltage applied to the RRAM array, the voltage being within an operational voltage range of the RRAM array;
            a resistive material layer covering the single protruded step portion of the bottom electrode, the resistive material layer having a first step corresponding to the single protruded step portion of the bottom electrode, the bottom electrode disposed between the resistive material layer and the substrate; and
            a top electrode over the resistive material layer and covering the first step of the resistive material layer, the top electrode having a second step corresponding to the first step of the resistive material layer, a resistance of the top electrode being independent of the voltage applied to the RRAM array, the resistive material layer having a same material composition and extending continuously from the bottom electrode to the top electrode;
    wherein:

the bottom electrode, the resistive material layer, and top electrode have opposing coterminous sidewalls; and the single protruded step portions in each RRAM pair are mirror images.

11. The RRAM array of claim 10, further comprising a transistor connected to the bottom electrode or the top electrode of each RRAM structure.

12. The RRAM array of claim 10, wherein the resistive material layer has a thickness less than about 300 angstroms.

13. The RRAM array of claim 10, wherein the resistive material layer comprises a high-k dielectric.

14. The RRAM array of claim 10, wherein the RRAM pairs in adjacent rows are mirror images of each other.

15. The RRAM of claim 10, wherein the top electrode has a first conductive layer and a second conductive layer, the first conductive layer being between the second conductive layer and the resistive material layer, wherein the first conductive layer and the second conductive layer are formed of different materials.

16. The RRAM of claim 15, wherein the first conductive layer is formed of a metal, and the second conductive layer is formed of doped polysilicon.

17. A resistive random access memory (RRAM), comprising:
a first RRAM structure over a substrate and a second RRAM structure over the substrate, the first RRAM structure having a bottom electrode layer, a resistive material layer, and a top electrode layer, wherein the bottom electrode layer, the resistive material layer, and the top electrode layer have coterminous sidewalls, wherein the top electrode layer extends further from the substrate than the bottom electrode layer;
the bottom electrode layer having a first edge substantially perpendicular to a first upper surface, a second edge substantially perpendicular to a second upper surface, a first sidewall between the first edge and the second edge and connecting the first upper surface and the second upper surface, a third edge substantially perpendicular to a third upper surface, and a fourth edge substantially perpendicular to a fourth upper surface, a second sidewall between the third edge and the fourth edge and connecting the third upper surface and the fourth upper surface, a resistance of the bottom electrode layer being independent of a normal operational voltage applied to the RRAM, wherein:
the first RRAM structure comprises the first edge, the first sidewall, and the second edge;
the second RRAM structure comprises the third edge, the second sidewall, and the fourth edge;
the first upper surface is above the second upper surface, the first sidewall intersecting the second upper surface at an acute angle;
the fourth upper surface is above the third upper surface, the second sidewall intersecting the third upper surface at an acute angle;
the second upper surface and the third upper surface are interposed between the first upper surface and the fourth upper surface, the second upper surface and the third upper surface disposed at a same first level, the first upper surface and the fourth upper surface disposed at a same second level;
the first RRAM structure comprises a first protruding step portion transitioning from the first upper surface to the second upper surface, the second upper surface being flat and extending from a first outer sidewall of the bottom electrode layer to the first protruding step portion; and
the second RRAM structure comprises a second protruding step portion transitioning from the third upper surface to the fourth upper surface, the third upper surface being flat and extending from a second outer sidewall of the bottom electrode layer to the second protruding step portion;
the resistive material layer on the bottom electrode layer and covering the first protruded step portion and the second protruded step portion, the resistive material layer having a third protruded step portion corresponding to and over the first protruded step portion, and a fourth protruded step portion corresponding to and over the second protruded step portion, the resistive material layer comprising a metal oxide; and
the top electrode layer on the resistive material layer, the top electrode layer comprising a first portion covering the third protruded step portion, and a second portion covering the fourth protruded step portion, the first portion of the top electrode layer having a fifth protruded step portion corresponding to and over the third protruded step portion, the second portion of the top electrode layer having a sixth protruded step portion corresponding to and over the fourth protruded step portion, wherein the first portion of the top electrode layer is separated from the second portion of the top electrode layer, wherein a resistance of the top electrode layer being independent of the normal operational voltage applied to the RRAM, wherein the resistive material layer contacts the top electrode layer and the bottom electrode layer, and wherein a composition of the resistive material layer remain a same from the bottom electrode layer to the top electrode layer.

18. The RRAM of claim 17, wherein the first portion of the top electrode layer, the resistive material layer, and the bottom electrode layer form the first RRAM structure, and the second portion of the top electrode layer, the resistive material layer, and the bottom electrode layer form the second RRAM structure, wherein the first RRAM structure and the second RRAM structure are mirror images of each other.

19. The RRAM of claim 17, wherein a ratio of a first height of the first protruded step portion to a second height of the first upper surface of the bottom electrode layer is less than 30%.

20. The RRAM of claim 17, wherein the top electrode layer comprises a tantalum nitride layer over a titanium layer.

21. The RRAM of claim 17, wherein a height of the first protruded step portion is less than 50 angstroms.

* * * * *